United States Patent
Okita

(10) Patent No.: US 7,812,372 B2
(45) Date of Patent: Oct. 12, 2010

(54) SEMICONDUCTOR DEVICE HAVING A SUPPORT SUBSTRATE PARTIALLY HAVING METAL PART EXTENDING ACROSS ITS THICKNESS

(75) Inventor: Hideyuki Okita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 110 days.

(21) Appl. No.: 11/902,307

(22) Filed: Sep. 20, 2007

(65) Prior Publication Data
US 2008/0210977 A1    Sep. 4, 2008

(30) Foreign Application Priority Data
Sep. 22, 2006   (JP)   .............. 2006-257577

(51) Int. Cl.
*H01L 29/778*   (2006.01)
(52) U.S. Cl. ................ 257/194; 257/187; 257/E29.246
(58) Field of Classification Search .......... 257/187, 257/194, E29.246
See application file for complete search history.

(56) References Cited

U.S. PATENT DOCUMENTS

| | | | |
|---|---|---|---|
| 5,504,036 A | | 4/1996 | Dekker et al. |
| 6,489,628 B1* | | 12/2002 | Morizuka ............. 257/12 |
| 6,555,405 B2* | | 4/2003 | Chen et al. ........... 438/22 |
| 7,250,643 B2* | | 7/2007 | Nishi ................. 257/194 |
| 7,368,793 B2* | | 5/2008 | Yanagihara et al. ..... 257/409 |
| 2002/0030267 A1* | | 3/2002 | Suzuki ............... 257/698 |
| 2004/0238842 A1* | | 12/2004 | Micovic et al. ........ 257/192 |
| 2005/0106771 A1* | | 5/2005 | Onishi ................. 438/37 |
| 2006/0055027 A1* | | 3/2006 | Kitabatake et al. ..... 257/706 |
| 2008/0128846 A1* | | 6/2008 | Bui et al. ............. 257/437 |

FOREIGN PATENT DOCUMENTS

| JP | 2003-197980 | 7/2003 |
|---|---|---|
| JP | 2004-071886 | 3/2004 |

OTHER PUBLICATIONS

"Now, come out to the field! GaN Electronic Device" Semiconductor Industry Newspaper Forum, 2003.
P.G.M. Baltus, et al., "A 3.5-mW, 2.5-GHz Diversity Receiver and a 1.2-mW, 3.6-GHz VCO in Silicon on Anything", IEEE Journal of Solid-State Circuits, vol. 33, No. 12 pp. 2074-2079 (1998).

* cited by examiner

*Primary Examiner*—Davienne Monbleau
*Assistant Examiner*—Hajar Kolahdouzan
(74) *Attorney, Agent, or Firm*—Rabin & Berdo, PC

(57) ABSTRACT

A semiconductor device includes a support substrate and a semiconductor layer formed on the underlying substrate. The support substrate has its metal part formed by plating and extending across its entire thickness, whilst it has the other region made of semiconductor part. In particular, the region of the support substrate lying immediately below an active region is the metal part formed by plating. The region of the support substrate lying immediately below the region other than the active region is an inactive region made of semiconductor. The semiconductor device thus suppresses warping of a substrate otherwise caused by stress in the metal part formed by plating, and heat evolved due to the current in operation of the semiconductor device may be dissipated over the shortest path through the metal part having a higher thermal conductivity.

24 Claims, 11 Drawing Sheets

SEMICONDUCTOR DEVICE HAVING A SUPPORT SUBSTRATE PARTIALLY HAVING METAL PART EXTENDING ACROSS ITS THICKNESS

BACKGROUND OF THE INVENTION

1. Field of the Invention

The present invention relates to a semiconductor device, and more particularly to a semiconductor device in which a support substrate has a metallic part produced by plating and its remaining part made of semiconductor.

2. Description of the Background Art

In packaging a semiconductor device, a support substrate, prepared by one of the following two methods, is used to facilitate handling of the device.

The first method will now be described with reference to FIGS. 6A to 6D, according to an article, "Now, come out to the field! GaN Electronic Device" Semiconductor Industry Newspaper Forum, 2003, for example. Initially, a metal wiring 150, which functions as an electrode or connection, is formed on an underlying substrate 130. The surface of the underlying substrate 130 and the metal wiring 150 are buried by a surface protective film 160 to prepare a semiconductor wafer, as shown in FIG. 6A. The underlying substrate 130 is then worked into a thin film, 30 to 50 μm thick, to yield a support substrate 132 as the underlying substrate reduced in thickness, as shown in FIG. 6B. A metallic film 120 is then formed by sputtering or plating on the reverse side of the support substrate 132, FIG. 6C. Finally, the semiconductor wafer is separated into chips by, e.g. dicing, as shown in FIG. 6D.

The second method will now be described with reference to FIGS. 7A to 7D, according to U.S. Pat. No. 5,504,036 to Dekker et al., and P. G. M. Baltus, et al., "A 3.5-mW, 2.5-GHz Diversity Receiver and a 1.2-mW, 3.6-GHz VCO in Silicon on Anything", IEEE Journal of Solid-State Circuits, Vol. 33, No. 12 pp. 2074-2079 (1998), for example. In the second method, a metal wiring 150, which functions as an electrode or a connection, is formed on an SOI substrate 135, composed of an underlying semiconductor layer 136, a buried oxide (BOX) layer 137 on the underlying semiconductor layer 136, and an SOI layer 138 on the BOX layer 137. The surface of the SOI substrate 135 and the metal wiring 150 are buried by a surface protective film 160 to prepare a semiconductor wafer, as shown in FIG. 4I. Another support substrate 180 of an insulating or electrically conductive material is then stuck on the surface protective film 160, using an adhesive 170, such as an epoxy adhesive or an acrylate adhesive, as shown in FIG. 7B. The underlying semiconductor layer 136 of the SOI substrate 135 is then etched or ground off, as shown in FIG. 7C. Finally, the semiconductor wafer is separated into chips by, e.g. dicing, as shown in FIG. 7D.

With the above-described first method, the silicon substrate, functioning as a support substrate, is poor in heat dissipation performance. So, the semiconductor device, which includes the substrate and evolves much heat, is likely to be deteriorated in performance. The second method, in which the additional support substrate is stuck onto the semiconductor wafer by means of adhesive, is difficult to apply to a device, which evolves much heat, from the standpoint of thermal resistance of the adhesive.

The third method has been reported, in which, after the underlying semiconductor substrate on the reverse side is completely removed, a plating layer is formed on the reverse surface, and used as a new support substrate, see Japanese Patent Laid-Open Publication No. 2003-197980, for example.

The fourth method has been proposed, in which a portion of a support substrate, from which heat is to be dissipated, is formed by a thin film and a plating layer is formed on this thin film, see Japanese Patent Laid-Open Publication No. 2004-71886, for example.

With the above-described third method, there is fear that the substrate becomes warped due to the stress in the plating layer served as a support substrate, and hence the product is difficult to use in the from of semiconductor device.

With the fourth method, the semiconductor support substrate persists in an active region in need of heat dissipation, and hence the heat dissipation is not sufficient. In this case, the semiconductor device is likely to be deteriorated in performance.

With this in mind, the inventor of the present patent application has conducted eager searches, and has found that the support substrate has its metal part formed by plating and extending across the entire thickness of the support substrate, and its remaining portion made of semiconductor to form a semiconductor device, which is superior in heat dissipation performance, there being no warping of the substrate otherwise caused by the stress in the plated layer.

The present inventor has particularly found that the support substrate has its metal part formed immediately below the active region of a semiconductor device, through which flows the current in operation of the semiconductor device, and its other portion immediately below the inactive region of the semiconductor device made of semiconductor, so that heat dissipation may be carried out more effectively.

SUMMARY OF THE INVENTION

In view of the above-described state of art, it is an object of the present invention to provide a semiconductor device which is superior in heat dissipation performance and with which it is possible to suppress the substrate from warping.

In accordance with the present invention, there is provided a semiconductor device comprising a support substrate, and a semiconductor layer formed on the support substrate, wherein the support substrate has its metal part formed by plating and extending across the entire thickness of the support substrate, and its remaining region made of semiconductor.

In implementing the semiconductor device according to the present invention, preferably the region of the support substrate immediately below the active region of the semiconductor layer is the metal part formed by plating, and the region of the support substrate immediately below a region other than the active region, that is, the inactive region, of the semiconductor layer, is a semiconductor part.

Since the semiconductor device of the present invention is carried by both the metal part formed by plating and the semiconductor part, it is possible to suppress the warping of the substrate otherwise caused by the stress in the metal part formed by plating.

In particular, the metal part, when formed in the region of the support substrate immediately below the active region through which the current flows in operation of the semiconductor device, is highly efficient since the path of heat dissi-

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Preferred embodiments of the present invention will now be described with reference to the accompanying drawings. It is noted that the shape, dimension and positional relationships of components and parts are shown only schematically to such an extent that those skilled in the art will understand the present invention. It is also noted that, in the preferred embodiments of the present invention, as now described, the composition or the material types of the components or parts as well as numerical conditions are given only by way of illustration and are not intended to restrict the invention.

Figure 1:
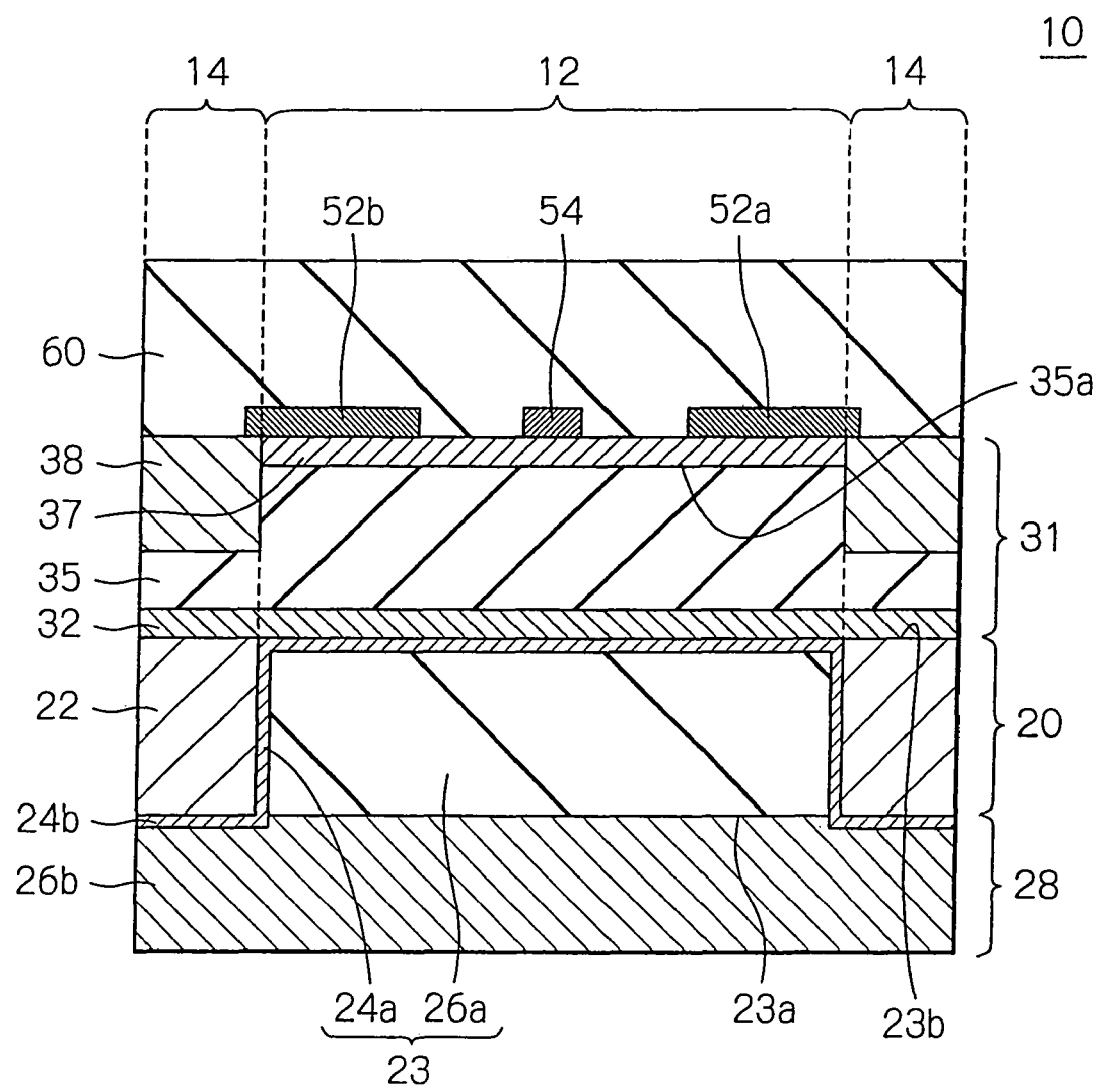
FIG. 1 is a schematic cross-sectional view showing essential portions of an embodiment of a GaN semiconductor field effect transistor, and specifically showing an end face thereof in cross-section.

With reference to FIG. 1, a preferred embodiment of a GaN semiconductor field effect transistor will be described in detail. FIG. 1 depicts a cross-sectional view showing essential portions of an embodiment of a GaN semiconductor field effect transistor, taken along an end face of the GaN semiconductor field effect transistor, and looking from the end face thereof shown in cross-section.

A description will be made on a GaN semiconductor field effect transistor (GaN-HEMT) 10, as an example of semiconductor device. The GaN-HEMT 10 includes a support substrate 20 and a semiconductor layer 31 formed on one 23b of the primary surfaces of the support substrate 20.

The semiconductor layer 31 includes a buffer layer 32, a channel layer 35 and a carrier supply layer 37, sequentially layered on a support substrate 20 in this order. The buffer layer 32 is a mono- or multi-layer film of aluminum nitride (AlN), gallium nitride (GaN) or aluminum gallium nitride (AlGaN). The buffer layer 32 plays the role of producing a lattice relaxation effect between the support substrate 20 and the channel layer 35. The channel layer 35 is formed by a GaN film, for example. The carrier supply layer 37 is formed by an AlGaN film, for example. These different layers of the semiconductor layer 31 are formed by, for example, a metalorganic chemical vapor deposition method or a molecular beam epitaxy method.

The junction formed between the channel layer 35 and the carrier supply layer 37 is a hetero-junction having its energy band structure forming a potential well. The electrons confined in this potential well has no degree of freedom of motion, or mobility, in a direction substantially perpendicular to a junction plane 35a of the hetero-junction 35, and are called a two-dimensional electron gas. The two-dimensional electron gas has a high degree of freedom of electron movement and the current of the electron gas flowing between the source and drain electrodes of the transistor is controlled by the voltage applied to the gate electrode. On the upper surface of the carrier supply layer 37, a GaN layer may be provided, as a cap layer, for reducing the gate leakage current.

On the semiconductor layer 31, a device isolation region 38 is formed on the semiconductor layer 31 by implanting ions of argon (Ar) or nitrogen (N). When the GaN-HEMT 10 is seen in a plan view, the region of the semiconductor layer 31 where the device isolation region 38 is formed is called an inactive region 14. The inactive region 14 is such a region where no current flows in operation of the semiconductor device. The region delimited by the inactive region 14 is called an active region 12, which is a region where current flows in operation of the semiconductor device.

On the upper surface of the active region is formed a gate electrode 54 providing the Schottky effect. On both sides of and at a distance from the gate electrode 54 are formed the first and second main electrodes 52a and 52b. These main electrodes 52a and 52b are ohmic contact electrodes and operate as a drain electrode 52a and as a source electrode 52b, respectively. In operation of the field effect transistor, there flows the current in the portion of the channel layer 35 lying between the source and drain electrodes, that is, in the portion of the channel layer 35 in register with the active region 12. Meanwhile, it is sufficient that the drain electrode 52a and the source electrode 52b are provided so that the current will flow in the portion of the channel layer 35 lying between the two electrodes. Hence, these electrodes may partially overlie the device isolation region 38.

On the semiconductor layer 31 is formed a surface protective film 60 to overlie the gate electrode 54, the drain electrode 52a and the source electrode 52b. The surface protective film 60 is, e.g. a silicon nitride film, a silicon oxide film or a silicon oxide nitride film.

Meanwhile, the configuration of the semiconductor layer 31, the electrodes 52a, 52b and 54, formed on the semiconductor layer 31, and the surface protective film 60, may be similar to that of the conventional GaN-HEMT.

The support substrate 20 has its metal part 23 formed by plating, and the remaining portion 22 thereof, i.e. except the metal part 23, made of semiconductor, for example, silicon. The metal part 23 is provided across the entire thickness of the support substrate 20. The support substrate 20, formed by the metal part 23 and the semiconductor part 22, in this manner, allows the heat evolved in the GaN-HEMT 10 to be conducted from the semiconductor layer 31 to outside via the metal part 23 having its thermal conductivity high. Hence, the support substrate 20 assures sufficient heat dissipation from the semiconductor layer 31. Meanwhile, the metal part 23 is a generic term which generally covers both a current electrode 24a for plating, used in carrying out plating, and a plated electrode 26a, formed by plating.

On the lower surface, in FIG. 1, of the support substrate 20, that is, on the other primary surface 23a opposite to the one primary surface 23b of the support substrate 20 carrying the semiconductor layer 31, there is formed a metal layer 28. The metal layer 28 is made up of a current electrode for plating 24b and a plated electrode 26b, and is formed as one with the metal part 23. If the support substrate 20 is of a thickness necessary for handling a semiconductor device, the metal layer 28 may be dispensed with.

With the above-described semiconductor device, the circuitry is carried by both the metal part 23 formed by plating and by the semiconductor part 22. This suppresses warping of the substrate otherwise caused by the stress in the metal part 23 formed by plating.

The metal part 23, formed by plating, is desirably provided immediately below the active region 12, through which flows the current in operation of the semiconductor device, since this provides the shortest path for heat dissipation through the metal part 23 of high thermal conductivity, thus assuring utmost efficiency. In other words, it is most preferable that the region of the support substrate 20 immediately below the active region 12 is set or functions as the metal part 23, and the region immediately below the inactive region 14 is set or functions as the semiconductor part 22.

Meanwhile, FIG. 1 shows an illustrative constitution where a region provided with the device isolation region 38, that is, a device isolation region, is set as the inactive region 14, and the region of the support substrate 20 associated with the inactive region is set as the semiconductor part 22, with the support substrate region other than the semiconductor part 22 being the metal part 23. It is however unnecessary for the inactive region 14 to be in register with the region of the support substrate 20 carrying the semiconductor part 22. The dimension of the metal part 23 and the semiconductor part 22 may be set in dependence upon the heat evolved in the semiconductor device or the stress in the metal part 23 formed by plating.

In the foregoing description, GaN-HEMT is taken as an example of the semiconductor device. However, the present invention is not limited to this example, but III-V group semiconductors, such as gallium arsenide (GaAs) or phosphorus indium (InP), may be used as the semiconductor layer. The present invention may also be applied to a semiconductor device comprised of an SOI substrate. In this case, the SOI substrate is accomplished by forming an underlying semiconductor layer, forming a buried oxide (BOX) layer on the underlying layer, and forming a silicon layer, that is, an SOI layer, on the BOX layer. The underlying layer is then removed until the BOX layer is partially exposed, and metal is formed by plating in the region freed of the underlying layer, thereby forming a new support substrate. In this newly formed support substrate, the remaining portion of the underlying layer becomes a semiconductor part, while the metal portion, buried by plating, becomes a metal part.

Figure 2:
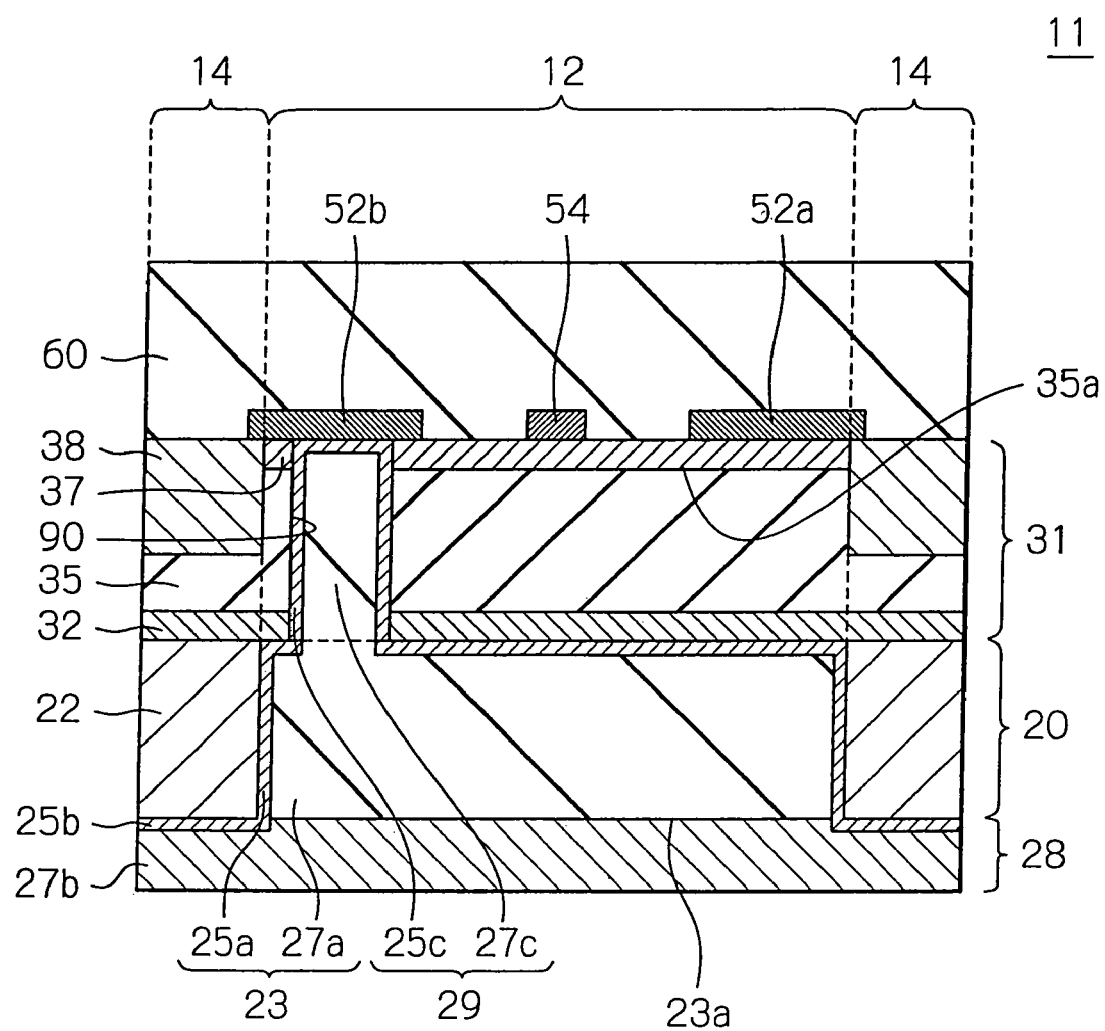
FIG. 2 is also a schematic cross-sectional view showing essential portions of an alternative embodiment of the GaN semiconductor field effect transistor, and specifically showing an end face thereof in cross-section.

An alternative embodiment of the GaN semiconductor field effect transistor, as a semiconductor device according to the present invention, will now be described with reference to FIG. 2, depicting a cross-sectional view showing essential portions of the present other embodiment of the GaN semiconductor field effect transistor, and specifically showing an end face thereof in cross-section.

A GaN-HEMT 11, shown in FIG. 2, may be the same as the GaN-HEMT described with reference to FIG. 1 except that a metal plug 29 for interconnecting the metal part 23 with the source electrode 52b is provided in the semiconductor layer 31. The GaN-HEMT 11 includes a current electrode 25, made up of current electrode portions 25a, 25b and 25c, and a plated electrode 27, made up of plated electrode portions 27a, 27b and 27c, lying in a through-hole 90 formed in the semiconductor layer 31. The current electrode portion 25c and the plated electrode portion 27c are generally termed the metal plug 29. By thus providing the metal plug 29, interconnecting the metal part 23 of the support substrate 20 with the source electrode 52b, in the semiconductor layer 31, the wiring interconnecting the metal part 23 of the support substrate 20, operating as a substrate electrode, with the source electrode 52b, may be shorter in length. Thus, the present alternative embodiment is suited for, e.g. a high frequency circuit where reducing the length of the wiring is a requirement.

Figure 3:
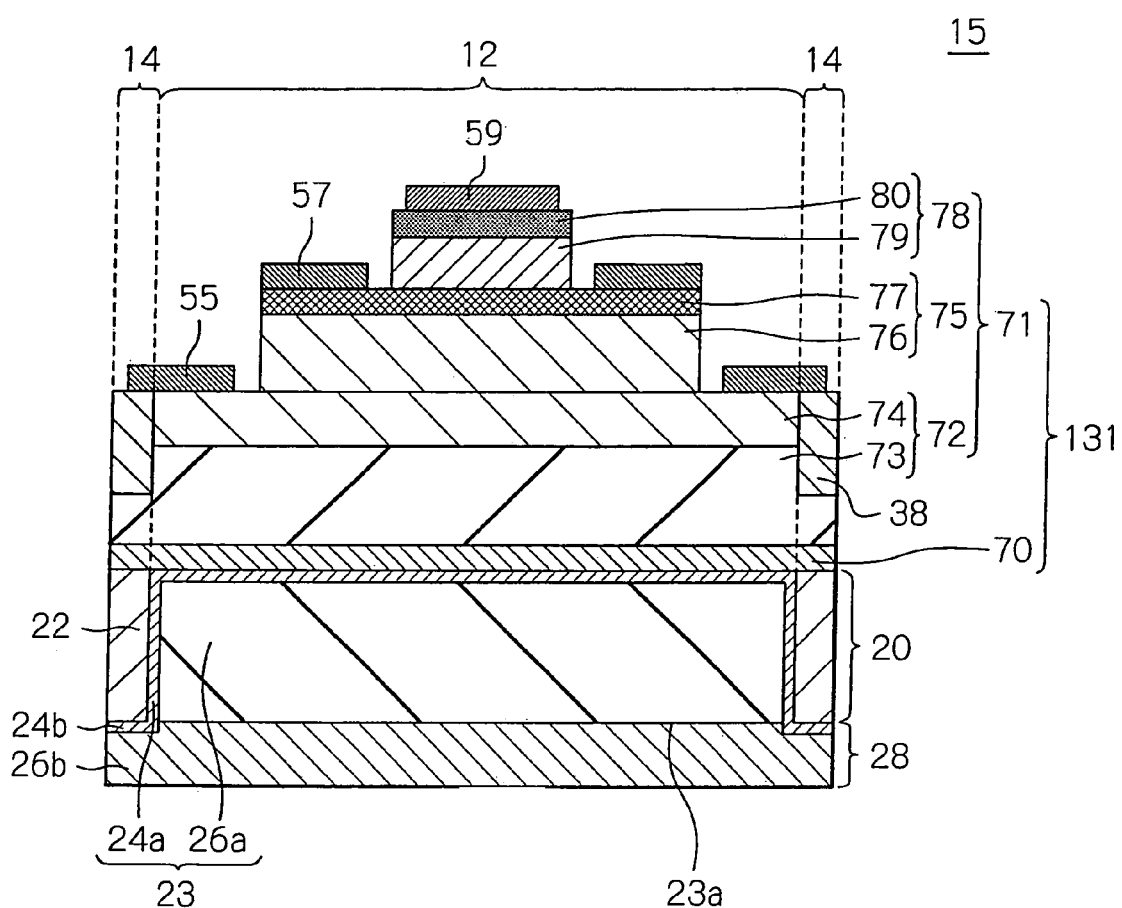
FIG. 3 is also a schematic cross-sectional view showing essential portions of an embodiment of a GaN semiconductor hetero-junction bipolar transistor, and specifically showing an end face thereof in cross-section.

Well, with reference to FIG. 3, description will be made on an illustrative constitution of a GaN semiconductor hetero-junction bipolar transistor (GaN-HBT) 15, serving as a semiconductor device according to the present invention. FIG. 3 is a cross-sectional view showing essential portions of an embodiment of a GaN semiconductor hetero-junction bipolar transistor, and specifically showing an end face thereof in cross-section.

The GaN semiconductor hetero-junction bipolar transistor 15 of the present embodiment is an NPN bipolar transistor, made up of the support substrate 20 and a semiconductor layer 131 formed on the support substrate 20. Meanwhile, the configuration of the NPN bipolar transistor, operating as a GaN-HBT, is well-known and hence the detailed description thereof is dispensed with. The constitution of the support substrate 20 may be the same as the GaN-HEMT already described with reference to FIG. 1.

The semiconductor layer 131 includes a buffer layer 70 and a multi-layered semiconductor structure 71. The multi-layered semiconductor structure 71 is of a double-step mesa structure made up of a collector part 72, a base part 75 and an emitter part 78. The base part 75 is formed in a mesa structure on the collector part 72, and the emitter part 78 is formed also in a mesa structure on the base part 75.

The collector part 72 includes a semi-insulating GaN layer (SI-GaN layer) 73 and an $N^+$-GaN layer 74 formed on the GaN layer 73. The $N^+$-GaN layer 74 is doped with an n-type impurity to a higher concentration.

The base part 75 is made up of an n-GaN layer 76, formed on the $N^+$-GaN layer 74, and a p-GaN layer 77, formed on the n-GaN layer 76. The n-GaN layer 76 is doped with an n-type impurity. The p-GaN layer 77 is doped with a p-type impurity.

The emitter part 78 includes an n-AlGaN layer 79 and an $n^+$-GaN layer 80 formed thereon. The n-AlGaN layer 79 is doped with an n-type impurity, while the $n^+$-GaN layer 80 is doped with an n-type impurity to a higher concentration.

As the n-type impurity, silicon (Si), for example, may be used and, as the p-type impurity, magnesium (Mg), for example may be used.

It is noted that the n-AlGaN layer 79 and the $n^+$-GaN layer 80 in the emitter part 78 act as the emitter of the transistor. The p-GaN layer 77 in the base part 75 acts as the base of the transistor, while the n-GaN layer 76 in the base part 75 and the $N^+$-GaN layer 74 in the collector part 72 act as the collector of the transistor.

On the collector part 72, a collector electrode 55 is formed, at a distance from the base part 75, which is formed as a mesa. On the base part 75, a base electrode 57 is formed at a distance from the emitter part 78, which is formed also as a mesa. On the emitter part 78 is formed an emitter electrode 59.

The support substrate 20 has its metal part 23 formed by plating, over the entire thickness of the support substrate 20, while the support substrate 20 has its remaining portion 22, other than the metal part 23, made of semiconductor, e.g. silicon. It is noted that, since the heat evolved in the GaN- HBT 15 is conducted from the multi-layered semiconductor structure 71 to outside through the metal part 23 exhibiting high thermal conductivity, the support substrate 20 assures sufficient heat dissipation from the semiconductor layer 131.

The above-described semiconductor device is carried by the support substrate 20 formed by both the metal part 23 formed by plating and the semiconductor part 22, thus suppressing the warping of the substrate otherwise caused by stress in the metal part formed by plating.

The metal part 23 formed by plating is preferably disposed immediately below the active region 12 where the current flows when the semiconductor device is in operation, since heat may then be dissipated via the shortest path thus to make for higher efficiency. Thus, it is desirable that the region of the support substrate 20 immediately below the active region 12 is the metal part 23, with the region of the support substrate 20 immediately below the inactive region 14 being the semiconductor part 22.

Figure 4A:
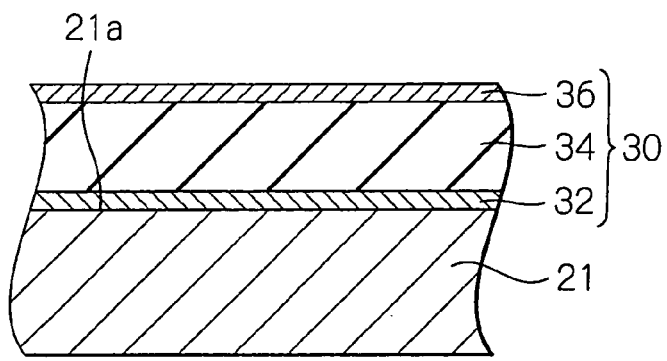
FIGS. 4A to 4N are schematic cross-sectional views for illustrating a process for fabrication of the GaN semiconductor field effect transistor shown in FIG. 1.
Figure 4B:
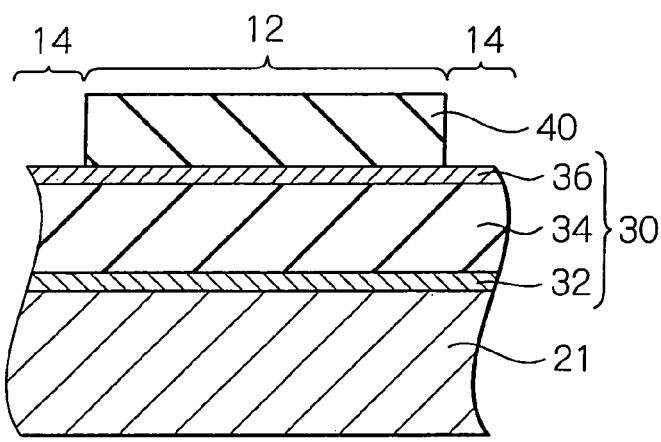
Figure 4C:
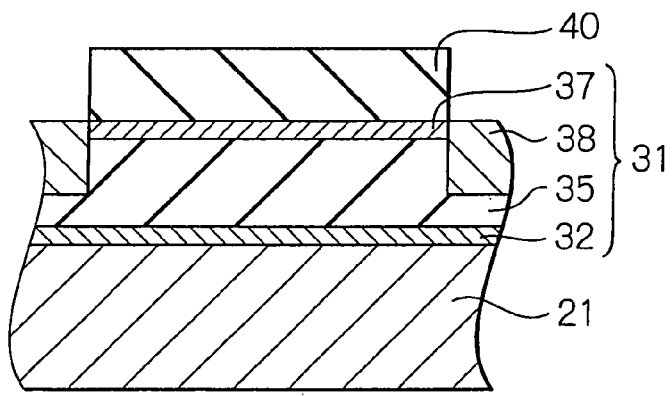
Figure 4D:
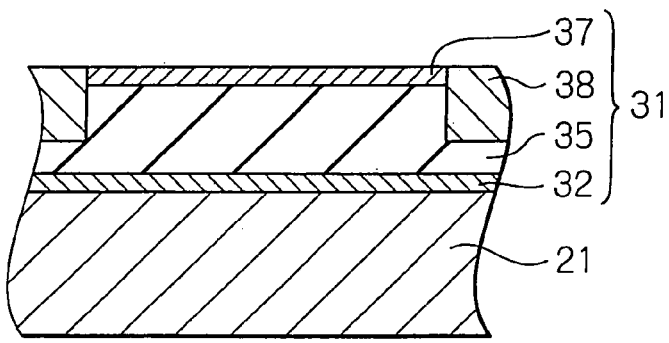
Figure 4E:
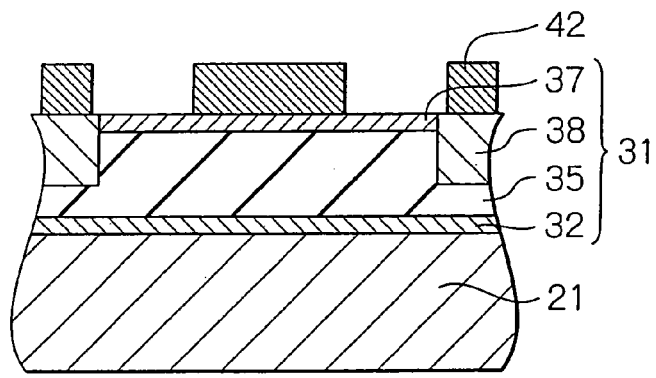
Figure 4F:
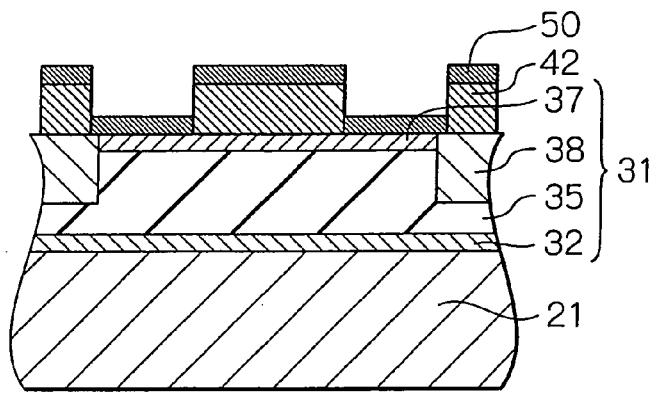
Figure 4G:
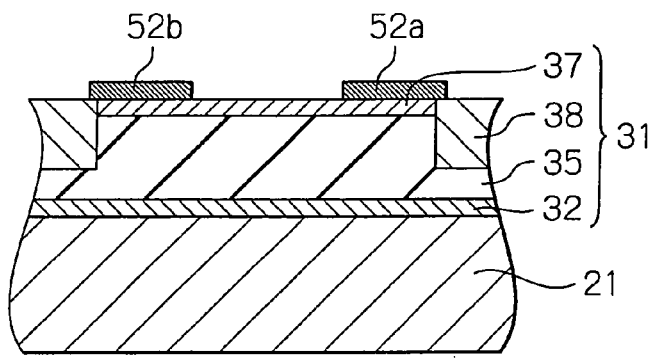
Figure 4H:
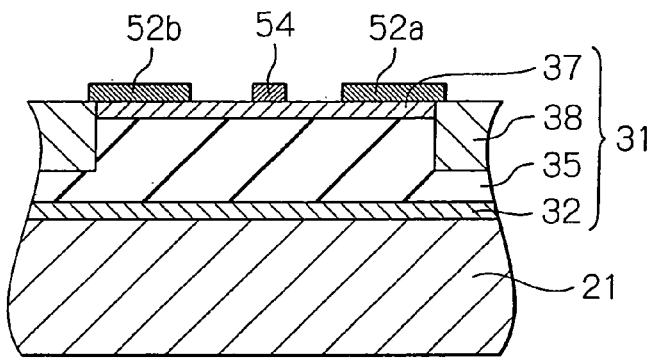
Figure 4I:
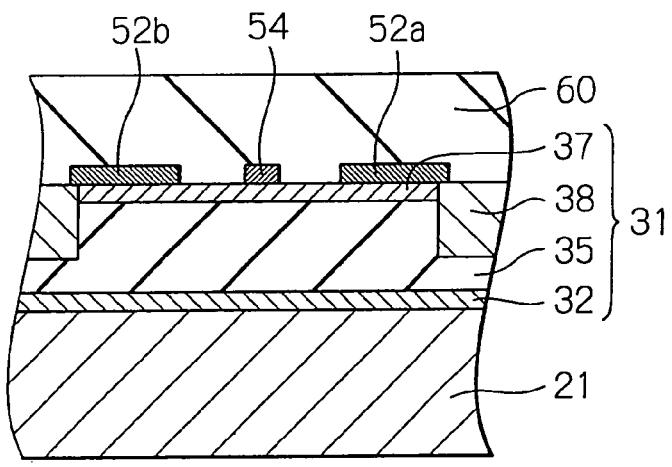
Figure 4J:
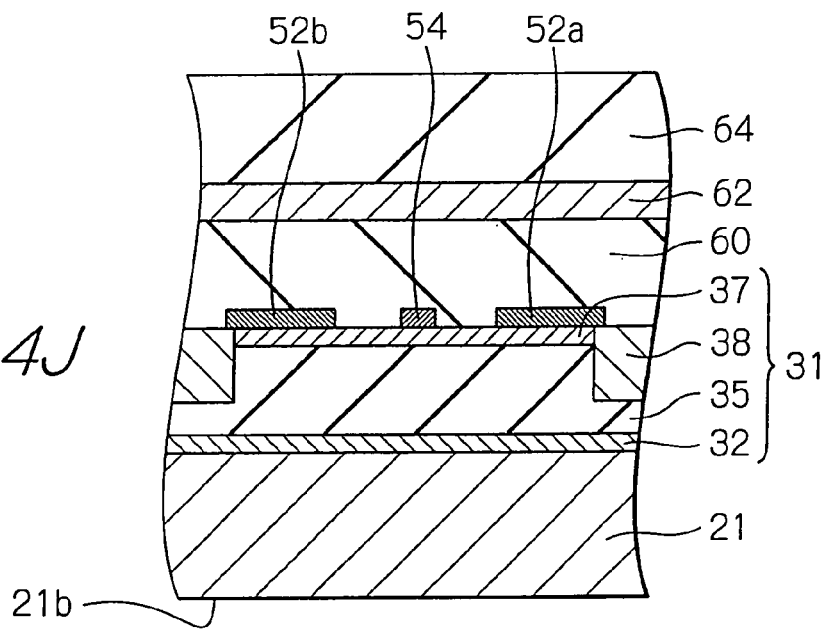
Figure 4K:
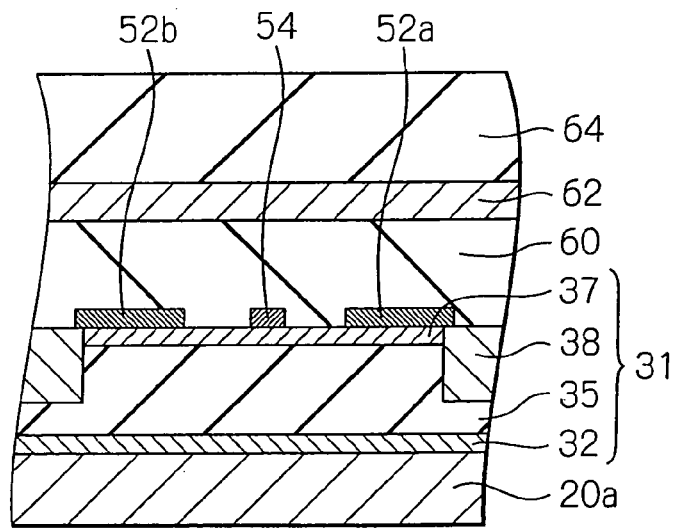
Figure 4L:
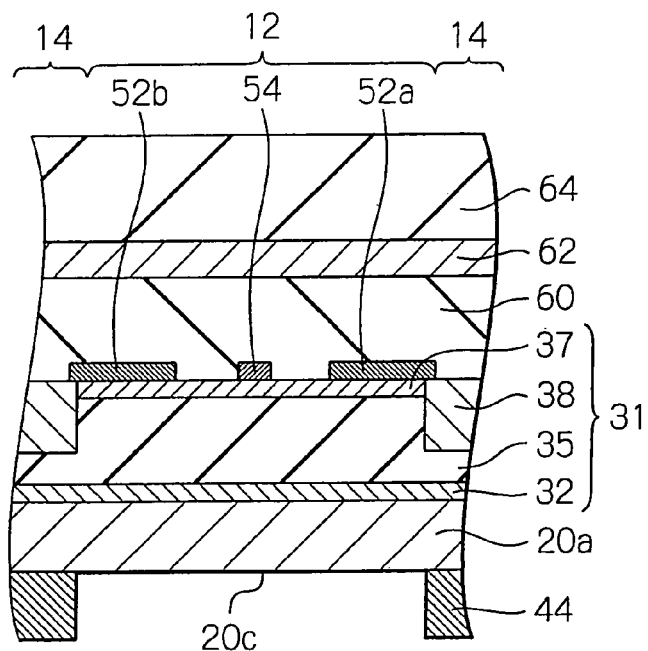
Figure 4M:
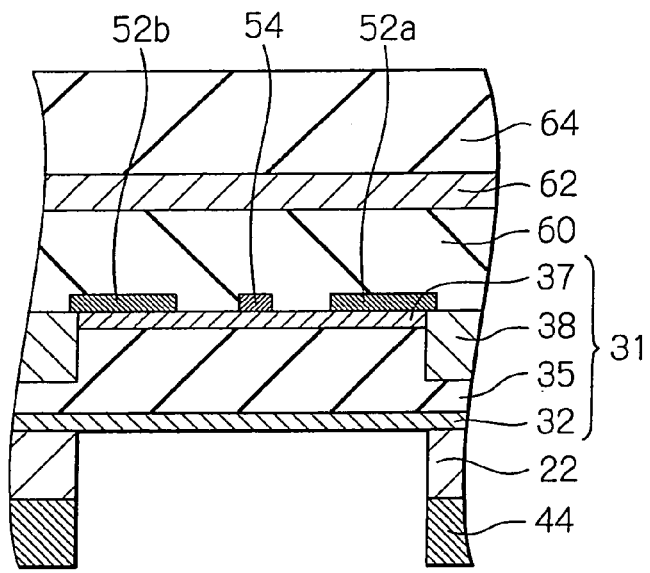
Figure 4N:
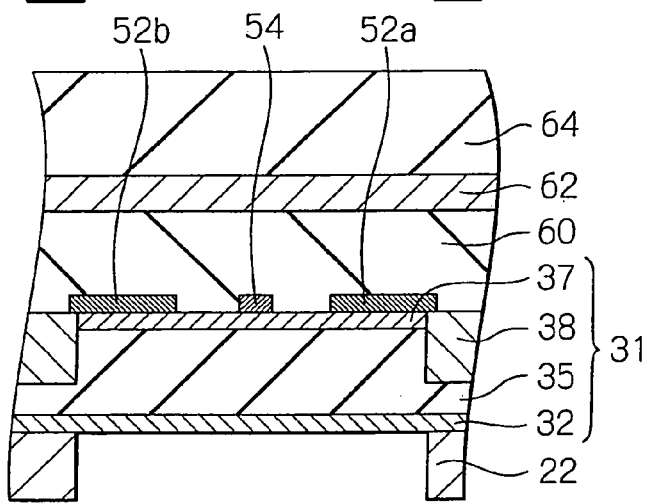

The method for fabricating the embodiment of the GaN semiconductor field effect transistor, described with reference to FIG. 1, will now be described with reference to FIGS. 4A to 4N illustrating the process steps for fabrication. Specifically, these figures show the end faces in cross-section of the essential portions of the structures obtained in the respective steps of the fabrication process.

Initially, a silicon substrate is provided as an underlying substrate 21. A semiconductor layer 30 is then formed on one major surface, i.e. on the upper surface 21a, of the underlying substrate 21. The semiconductor layer 30 is made up of a buffer layer 32, a channel layer 34 and a carrier supply layer 36, sequentially layered together in this order. The buffer layer 32 is a mono- or multi-layered film of AlN, GaN or AlGaN. The channel layer 34 is a GaN layer not doped with impurities. The carrier supply layer 36 is an AlGaN layer not doped with impurities. The buffer layer 32, the channel layer 34 and the carrier supply layer 36 are formed by any of known methods including the MOCVD (Metal-Organic Chemical Vapor Deposition) method or the MBE (Molecular Beam Epitaxy) method. It is noted that a GaN layer, not shown, may be provided, as a cap layer, on the top of the carrier supply layer 36, for reducing the gate leakage current, as shown in FIG. 4A.

A resist pattern 40 is then provided, by a conventional photolithographic method, on the semiconductor layer 30, which is made up of the buffer layer 32, the channel layer 34 and the carrier supply layer 36, sequentially layered together. The resist pattern 40 covers the semiconductor layer 30 of the active region 12, while exposing the semiconductor layer 30 of the inactive region 14, FIG. 4B.

The device isolation region 38 is then formed on the semiconductor layer 31 by ion implantation, using the resist pattern 40 as a mask. Here, the carrier supply layer and the channel layer of the inactive region 14 are processed in their entirety or only partially with ion implantation with Ar or N to elevate the electrical resistance of the so processed layer portions. These layer portions, exhibiting the elevated electrical resistance, represent a device isolation region 38. The portions of the carrier supply layer 37 and the channel layer 35 of the active region 12 are left without having the resistance elevated, as shown in FIG. 4C. Although the device separation is by forming the device isolation region 38, in the present embodiment, described above, it may also be by mesa isolation by dry etching, such as reactive ion etching (RIE).

The resist pattern 40 is then removed by an organic solvent, such as acetone, as shown in FIG. 4D.

A resist pattern 42 for forming ohmic contact electrodes is then formed on the semiconductor layer 31, using the conventional known photolithographic method. The resist pattern 42 for forming ohmic electrodes exposes the portion of the semiconductor layer 31 where the ohmic electrodes are to be formed, while covering up the remaining portion of the semiconductor layer 31, FIG. 4E.

A metal film 50 is then vapor-deposited, using the known conventional electron beam evaporation method, on the portions of the semiconductor layer 31, exposed by the openings, provided in the resist pattern 42, and on the resist pattern 42, FIG. 4F.

The ohmic electrode may be formed of known electrode materials. The metal film 50 is formed by, for example, a mono- or multi-layer film of Ti, Al, Mo or Ni. Then, ohmic electrodes 52a and 52b are formed, using a lift-off method of removing unneeded portions of the resist pattern 42 and the metal film 50 with any suitable known resist removing liquids. These ohmic electrodes 52a and 52b are used as drain electrode 52a and as source electrode 52b, FIG. 4G.

After forming the ohmic electrodes 52a and 52b, a gate electrode 54 is formed by a process similar to that used for forming the ohmic electrodes 52a and 52b. Initially, a photoresist is coated on the upper surface of the semiconductor layer 31. Then, any suitable one of known photographic methods, such as light exposure or development, is applied to the photoresist to form a resist pattern which exposes the upper surface of the region of the semiconductor layer 31 where the gate electrode is to be formed. Then, metal is vapor-deposited on the region of the semiconductor layer 31 exposed by an opening formed in the resist pattern, and on the resist pattern. The resist pattern is then removed, using any of known conventional resist removing liquid, namely, in accordance with the lift-off method, to form the gate electrode 54. This gate electrode 54 may be formed by any suitable known electrode materials and may, for example, be a mono-layer or multi-layer film of any of suitable known electrode materials, Ni, Pt or Au, as shown in FIG. 4H.

A surface protective film 60, covering the drain electrode 52a, the source electrode 52b and the gate electrode 54, as well as the wiring, is then formed on the semiconductor layer 31. The surface protective film 60 is formed by a mono-layer or multi-layer film of silicon oxide, silicon nitride or silicon oxide nitride. The surface protective film 60 is formed by the chemical vapor deposition (CVD) method or plasma assist CVD (PE-CVD) method as known per se, as shown in FIG. 4I.

An adhesive 62, such as an epoxy or acrylate adhesive, is coated on the surface protective film 60, and a holding substrate 64, such as a quartz substrate, a glass substrate or a silicon substrate, is bonded thereon. Since the holding substrate 64 is used only for grinding, as later described, it is only sufficient that the holding substrate holds the semiconductor device. There is no necessity to bond the holding substrate 64 if bonding the holding substrate is not needed in handling the semiconductor device, as shown in FIG. 4J.

The underlying substrate 21 is then ground to a thickness of 30 to 100 μm, beginning from the major surface of the underlying substrate 21 opposite to its major surface 21a, that is, from the lower surface 21b, and is thereby turned into an underlying substrate 20a, as shown in FIG. 4K.

A resist pattern 44 is then formed on a lower surface 20c of the underlying substrate 20a in accordance with a known conventional photolithographic method. The resist pattern 44 covers the underlying substrate 20a of the inactive region 14, while partially exposing the underlying substrate 20a of the active region 12, FIG. 4L.

The exposed portion of the underlying substrate 20a of the active region 12 is then removed by etching employing the resist pattern 44. This partially exposes the semiconductor layer 31, while leaving an unetched portion of the underlying substrate as the semiconductor part 22. This etching may be carried out as dry etching employing an $SF_6$ gas or as wet etching employing an alkaline solution such as KOH. Meanwhile, in carrying out dry etching, caution needs to be exercised so as not to cause plasma damage to the semiconductor layer, as shown in FIG. 4M.

The resist pattern 44 is then removed, using an organic solvent, such as acetone, as shown in FIG. 4N.

A current electrode for plating 24 (24a, 24b) is then formed on the lower surface of the semiconductor part 22 and on the exposed portion of the semiconductor layer 31. The current electrode 24 is formed as a mono-layer or multi-layer film of Ti, Au or Pt, using, e.g. an electron beam evaporation method or a sputtering method, see FIG. 1.

A plated electrode 26 (26a, 26b) is then formed on the current electrode 24 by plating employing the current electrode for plating 24. It is sufficient that the plated electrode 26 is formed of a material having high heat dissipating properties, that is, a material having thermal conductivity higher than that of the semiconductor material. This material may, for example be Au or Cu.

Finally, the adhesive 62 and the holding substrate 64, stuck onto the surface protective film 60, are removed. It is also possible to carry out dicing, with the holding substrate 64 bonded in position, for separation into plural chips, before removing the holding substrate 64. The GaN-HEMT, described with reference to FIG. 1, has thus been obtained by carrying out the above process steps.

The method for fabricating the embodiment of the GaN semiconductor field effect transistor, described with reference to FIG. 2, will now be described with reference to FIGS. 5A through 5E illustrating the process steps for fabricating the GaN semiconductor field effect transistor. Specifically, these figures show the end faces in cross-section of the essential portions of the structures obtained in the respective steps of the fabrication process.

The process of etching employing the resist pattern to remove the underlying substrate of the active region to expose the semiconductor layer 31 and to remove the resist pattern 44 may be the same as described with reference to FIGS. 4A to 4N and hence a repetitive description thereon will be dispensed with.

Figure 5A:
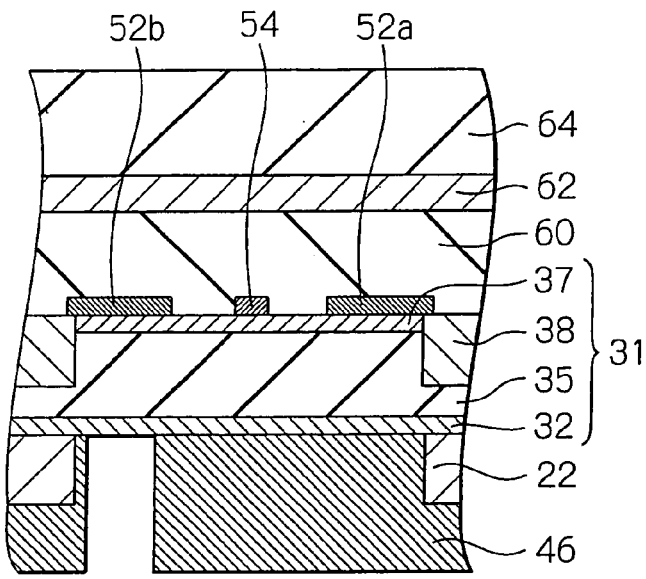
FIGS. 5A to 5E are schematic cross-sectional views for illustrating a process for fabrication of the GaN semiconductor field effect transistor shown in FIG. 2.

Following the step shown in FIG. 4N and after removing the resist pattern 44, another resist pattern 46 which partially exposes the semiconductor layer 31 lying immediately below the source electrode 52b is formed by a known conventional photolithographic method, as shown in FIG. 5A.

Figure 5B:
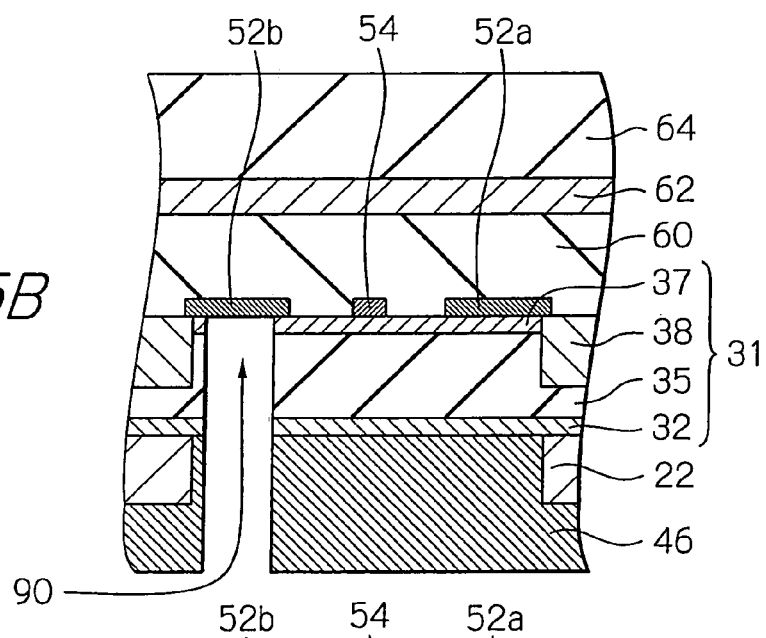

The region of the semiconductor layer 31 lying immediately below the source electrode 52b is removed to form the through-hole 90 by etching employing the resist pattern 46. This etching may be carried out by dry etching, as known per se, such as RIE, using $Cl_2$ or $BCl_3$ as a reaction gas. Since the source electrode 52b is formed of Ti, Al, Mo or Ni, the source electrode 52b acts as an etch stop in the dry etching employing $Cl_2$ or $BCl_3$ as the reaction gas. The etching therefore comes to a halt at a time point the source electrode 52b is exposed, as shown in FIG. 5B.

Figure 5C:
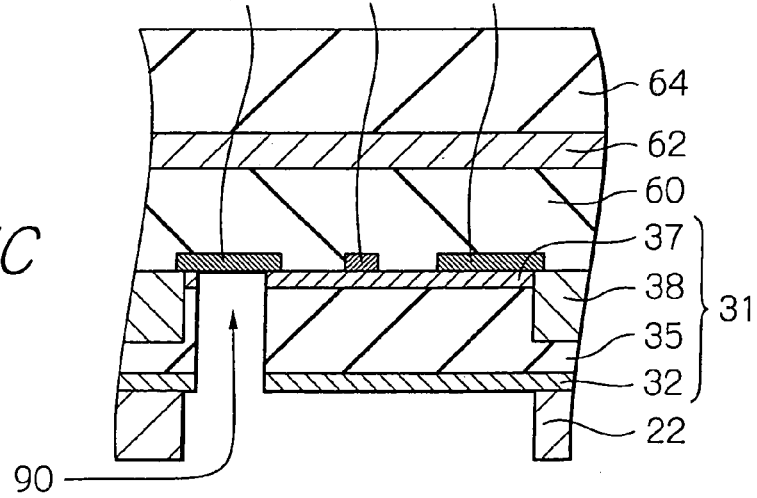

The resist pattern 46 is then removed, using an organic solvent, such as acetone, as shown in FIG. 5C.

Figure 5D:
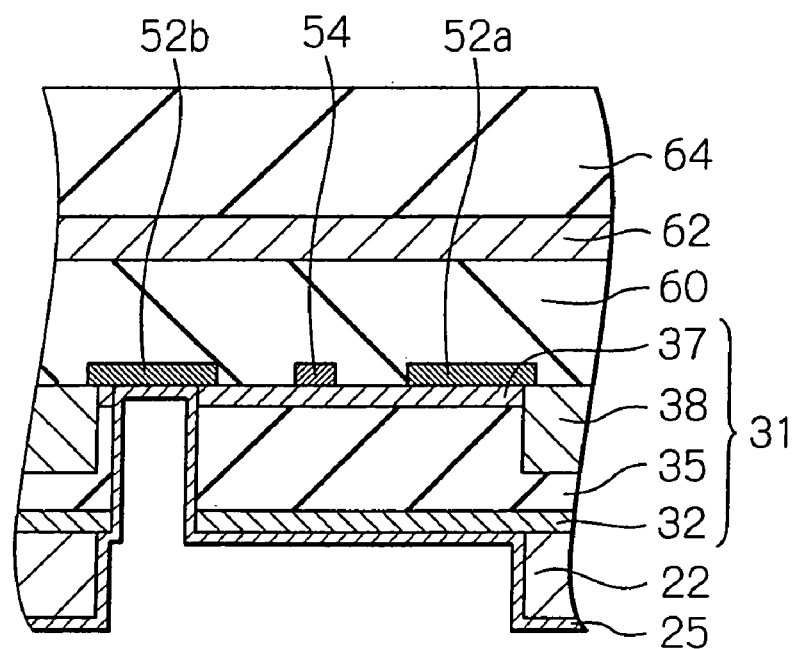
Figure 5E:
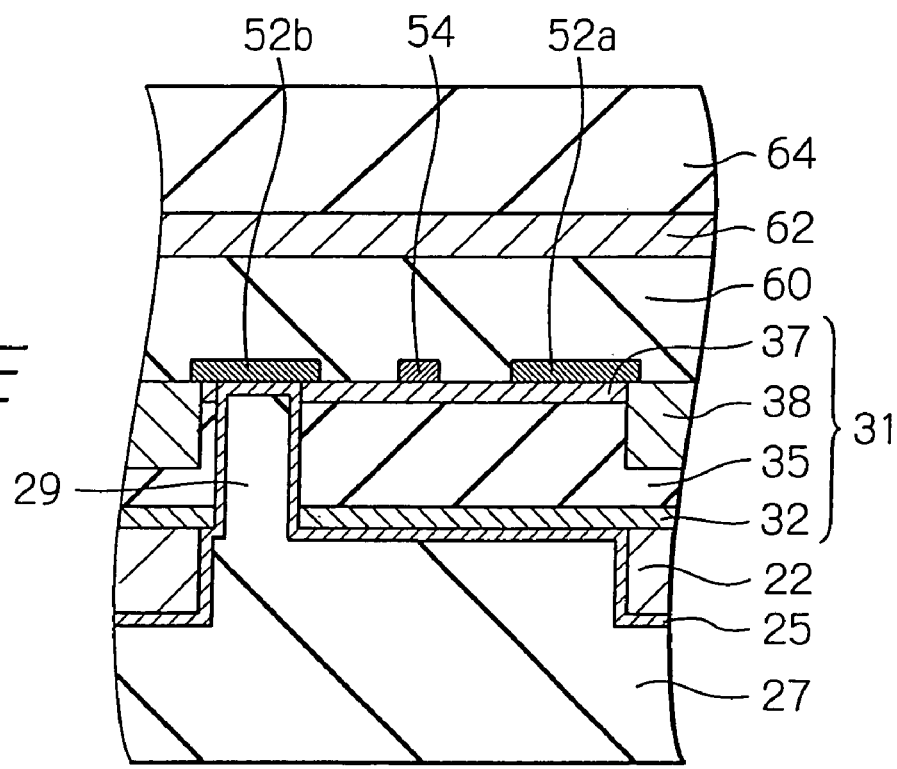
Figure 6A:
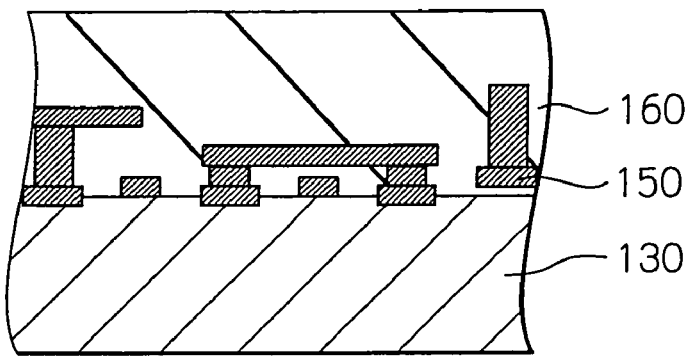
FIGS. 6A to 6D are schematic cross-sectional views for illustrating a conventional process for fabrication of a GaN semiconductor field effect transistor.
Figure 6B:
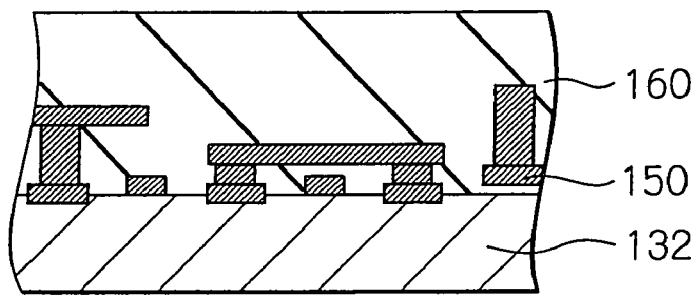
Figure 6C:
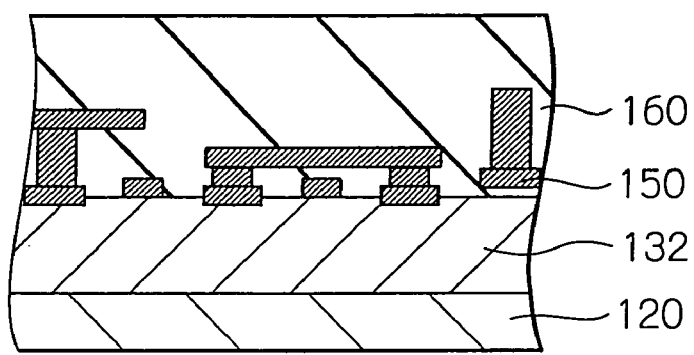
Figure 6D:
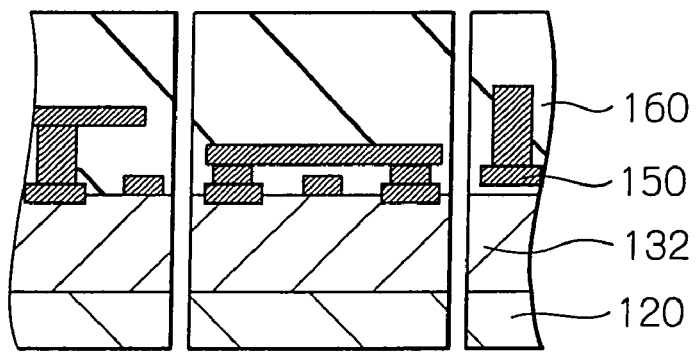
Figure 7A:
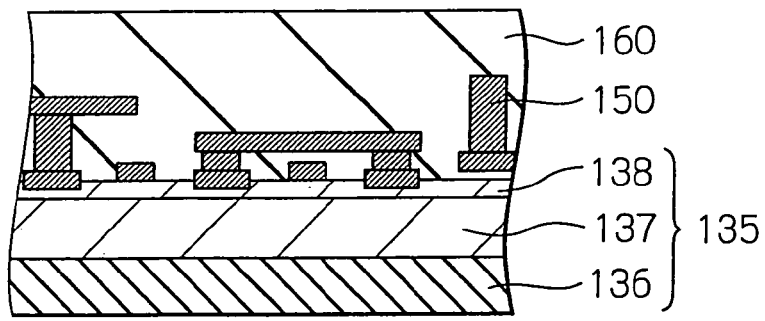
FIGS. 7A to 7D are cross-sectional views for illustrating another conventional process for fabrication of the GaN semiconductor field effect transistor.
Figure 7B:
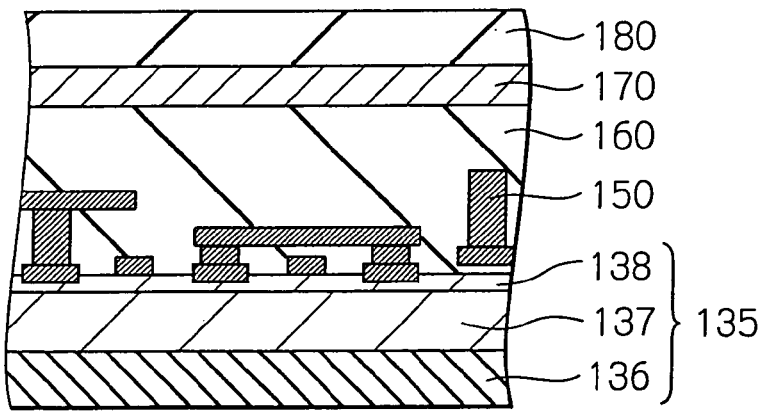
Figure 7C:
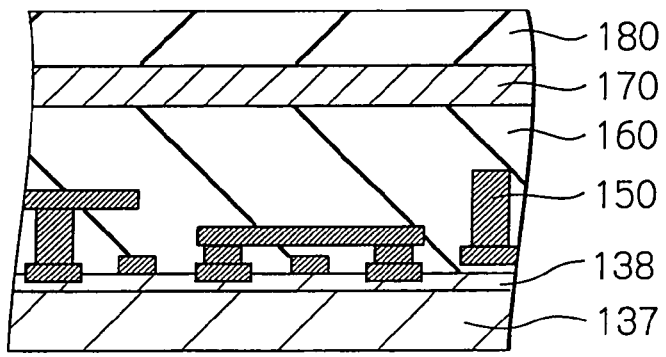
Figure 7D:
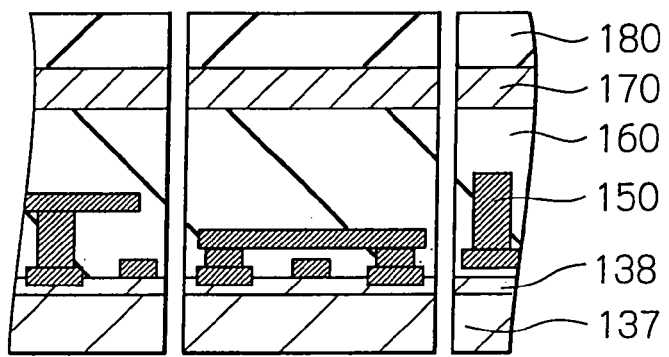

The current electrode for plating 25 (25a, 25b, 25c) is then formed on the lower surface of the semiconductor part 22 and on lateral sides of the source electrode 52b and the semiconductor layer 31 exposed within the through-hole 90. The current electrode for plating 25 is formed by, e.g. a mono-layer or multi-layer film of Ti, Au or Pt employing, e.g. the electron beam evaporation method or the sputtering method, as shown in FIG. 5D.

A plated electrode 27 is then formed on the current electrode for plating 25 by plating employing the current electrode for plating 25. It is sufficient that the plated electrode 27 (27a, 27b, 27c) is formed of a material having thermal conductivity higher than that of a semiconductor, such as Au or Cu. The portions of the current electrode for plating 25 and the plated electrode 27 lying within the through-hole 90 are called the metal plug 29, FIG. 5E.

Finally, the adhesive 62 and the holding substrate 64, stuck on the substrate surface, are then removed. It is also possible to carry out dicing, with the holding substrate 64 bonded in position, for separation into plural chips, before removing the holding substrate 64. The GaN-HEMT, described with reference to FIG. 2, has thus been obtained by carrying out the above process steps.

A method for fabricating the illustrative embodiment of the GaN semiconductor hetero-junction bipolar transistor, described with reference to FIG. 3, will now be briefly described. In preparing the GaN-HBT, the semiconductor layer and the electrodes, that is, the parts operating as the GaN-HBT, may be prepared using any of the methods as known per se. Also, the process of forming the semiconductor layer and the electrodes and thereafter setting the portions immediately below the active region and immediately below the inactive region of the support substrate as a plated metal part and as the silicon part, respectively, may be carried out in the same way as with GaN-HEMT described with reference to FIGS. 4K through 4N, and hence a repetitive description thereon will be dispensed with.

The entire disclosure of Japanese patent application No. 2006-257577 filed on Sep. 22, 2006, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A semiconductor device comprising:
   a support substrate including a metal part formed by plating to extend across an entire thickness and an entire length of the support substrate, and a semiconductor part horizontally disposed with respect to the metal part;
   a semiconductor layer formed on one primary surface of said support substrate, the semiconductor layer including a channel layer, and a buffer layer formed between the channel layer and the support substrate; and
   a source electrode, a gate electrode and a drain electrode formed on a primary surface of the semiconductor layer, opposite to said support substrate, for forming a field effect transistor that conducts a current from the source electrode to the drain electrode in direction substantially parallel to the primary surface of the semiconductor layer, the source, gate and drain electrodes being formed above the metal part of the support substrate.

2. The semiconductor device in accordance with claim 1, further comprising a metal layer provided on another primary surface of said support substrate opposite to the one primary surface of said support substrate.

3. The semiconductor device in accordance with claim 1, wherein said buffer layer is made of one of aluminum nitride (AlN), gallium nitride (GaN) and aluminum gallium nitride (AlGaN).

4. The semiconductor device in accordance with claim 3, wherein said buffer layer is formed as one of a mono-layer film and a multi-layer film.

5. The semiconductor device in accordance with claim 1, wherein said device forms a GaN-HEMT (High Electron Mobility Transistor).

6. A semiconductor device comprising: a support substrate; and
 a semiconductor layer formed on one primary surface of said support substrate, said semiconductor layer having an active region through which current flows in operation of said semiconductor device, and an inactive region horizontally disposed with respect to the active region, said support substrate having a metal part formed by plating to extend across an entire thickness and an entire length of the support substrate immediately below the active region, and a semiconductor region formed immediately below the inactive region and is made of semiconductor; and
 a source electrode, a gate electrode and a drain electrode formed on a primary surface of the semiconductor layer, opposite to said support substrate, for forming a field effect transistor that conducts a current from the source electrode to the drain electrode in direction substantially parallel to the primary surface of the semiconductor layer, the source, gate and drain electrodes being formed above the metal part of the support substrate and substantially in the active region.

7. The semiconductor device in accordance with claim 6, further comprising a metal layer provided on another primary surface of said support substrate opposite to the one primary surface of said support substrate.

8. The semiconductor device in accordance with claim 6, further comprising a device isolating film formed in the inactive region.

9. The semiconductor device in accordance with claim 8, further comprising a metal plug formed in the active region for interconnecting said metal part with the source electrode.

10. The semiconductor device in accordance with claim 6, wherein the semiconductor layer includes a channel layer, and a buffer layer formed between the channel layer and the support substrate.

11. The semiconductor device in accordance with claim 10, wherein said buffer layer is made of one of aluminum nitride (AlN), gallium nitride (GaN) and aluminum gallium nitride (AlGaN).

12. The semiconductor device in accordance with claim 11, wherein said buffer layer is formed as one of a mono-layer film and a multi-layer film.

13. The semiconductor device in accordance with claim 6, wherein said device forms a GaN-HEMT (High Electron Mobility Transistor).

14. A GaN-HEMT (High Electron Mobility Transistor) device comprising:
 a support substrate including a metal part formed by plating to extend across an entire thickness and an entire length of the support substrate, and a semiconductor part horizontally disposed with respect to the metal part;
 a semiconductor layer formed on one primary surface of said support substrate, and including a channel layer made of GaN and a buffer layer formed between the channel layer and the support substrate; and a source electrode, a gate electrode and a drain electrode formed on a primary surface of the semiconductor layer, opposite to said support substrate, for forming a GaN-HEMT field effect transistor that conducts a current from the source electrode to the drain electrode in direction substantially parallel to the primary surface of the semiconductor layer, the source, gate and drain electrodes being formed above the metal part of the support substrate.

15. The device in accordance with claim 14, further comprising a metal layer provided on another primary surface of said support substrate opposite to the one primary surface of said support substrate.

16. The device in accordance with claim 14, wherein said buffer layer is made of one of aluminum nitride (AlN), gallium nitride (GaN) and aluminum gallium nitride (AlGaN).

17. The device in accordance with claim 16, wherein said buffer layer is formed as one of a mono-layer film and a multi-layer film.

18. A GaN-HEMT (High Electron Mobility Transistor) device comprising: a support substrate;
 a semiconductor layer formed on one primary surface of said support substrate
 said semiconductor layer having an active, region through which current flows in operation of said semiconductor device and which includes a channel layer made of GaN, and an inactive region horizontally disposed with respect to the active region,
 said support substrate having a metal part formed by plating to extend across an entire thickness and an entire length of the support substrate immediately below the active region, and a semiconductor region formed immediately below the inactive region; and
 a source electrode, a gate electrode and a drain electrode formed on a primary surface of the semiconductor layer, opposite to said support substrate, for forming a GaN-HEMT field effect transistor that conducts a current from the source electrode to the drain electrode in direction substantially parallel to the primary surface of the semiconductor layer, the source, gate and drain electrodes being formed above the metal part of the support substrate and substantially in the active region.

19. The device in accordance with claim 18, further comprising a metal layer provided on another primary surface of said support substrate opposite to the one primary surface of said support substrate.

20. The device in accordance with claim 18, further comprising a device isolating film formed in the inactive region.

21. The device in accordance with claim 20, further comprising a metal plug formed in the active region for interconnecting the metal part with the source electrode.

22. The device in accordance with claim 18, wherein said semiconductor layer includes a buffer layer formed between the channel layer and the support substrate.

23. The device in accordance with claim 22, wherein said buffer layer is made of one of aluminum nitride (AlN), gallium nitride (GaN) and aluminum gallium nitride (AlGaN).

24. The device in accordance with claim 23, wherein said buffer layer is formed as one of a mono-layer film and a multi-layer film.

* * * * *